(12) United States Patent
Hopper et al.

(10) Patent No.: US 7,875,955 B1
(45) Date of Patent: Jan. 25, 2011

(54) ON-CHIP POWER INDUCTOR

(75) Inventors: Peter J. Hopper, San Jose, CA (US);
Peter Johnson, Sunnyvale, CA (US);
Kyuwoon Hwang, Palo Alto, CA (US);
Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 8 days.

(21) Appl. No.: 11/713,921

(22) Filed: Mar. 5, 2007

Related U.S. Application Data

(60) Provisional application No. 60/780,621, filed on Mar. 9, 2006.

(51) Int. Cl.
*H01L 27/08* (2006.01)
(52) U.S. Cl. .................. 257/531; 257/528; 257/516; 330/307; 336/200
(58) Field of Classification Search ............. 257/531, 257/528, 516; 330/307; 336/200
See application file for complete search history.

(56) References Cited

U.S. PATENT DOCUMENTS

| | | | | |
|---|---|---|---|---|
| 3,614,554 | A | 10/1971 | Shield et al. ............ 317/235 R |
| 3,798,059 | A | 3/1974 | Astle et al. ................. 117/212 |
| 4,956,636 | A | 9/1990 | Sansom et al. ............. 340/551 |
| 5,349,743 | A | 9/1994 | Grader et al. ............. 29/602.1 |
| 5,450,755 | A | 9/1995 | Saito et al. .................... 73/763 |
| 6,002,593 | A | 12/1999 | Tohya et al. ................ 361/765 |
| 6,037,649 | A | 3/2000 | Liou ........................... 257/531 |
| 6,114,937 | A | 9/2000 | Burghartz et al. ........... 336/200 |
| 6,239,684 | B1 | 5/2001 | Farrar et al. ................. 336/200 |
| 6,362,012 | B1 | 3/2002 | Chi et al. ........................ 438/3 |
| 6,417,755 | B1 | 7/2002 | Liu et al. .................... 336/200 |
| 6,429,651 | B1 | 8/2002 | Choi et al. .................. 324/249 |
| 6,491,229 | B1 | 12/2002 | Berney ........................ 235/492 |
| 6,495,019 | B1 | 12/2002 | Filas et al. ................... 205/119 |
| 6,573,818 | B1 | 6/2003 | Klemmer et al. .............. 336/83 |
| 6,707,367 | B2 * | 3/2004 | Castaneda et al. ........... 336/200 |
| 6,713,162 | B2 | 3/2004 | Takaya et al. ................ 428/209 |
| 6,759,275 | B1 | 7/2004 | Lee et al. ..................... 438/114 |
| 6,876,056 | B2 | 4/2005 | Tilmans et al. .............. 257/528 |
| 6,972,081 | B2 | 12/2005 | Wong .......................... 205/119 |
| 6,972,658 | B1 * | 12/2005 | Findley et al. ............... 336/200 |
| 7,135,103 | B2 | 11/2006 | Osaka et al. ................. 205/104 |
| 7,140,092 | B2 | 11/2006 | Park et al. .................. 29/602.1 |
| 7,463,131 | B1 | 12/2008 | Hwang et al. ............... 336/200 |

(Continued)

OTHER PUBLICATIONS

"A Fully Integrated Planar Toroidal Inductor with a Micromachined Nickel-Iron Magnetic Bar"; Chong H. Ahn, Yong J. Kim and Mark G. Allen, Members, IEEE; IEEE Transactions on Components, Packaging, and Manufacturing Technology—Part A. vol. 17, No. 3, Sep. 1994; pp. 463-469.

*Primary Examiner*—Michael B Shingleton
(74) *Attorney, Agent, or Firm*—Dergosits & Noah LLP

(57) ABSTRACT

An on-chip inductor structure for a DC-DC power regulator circuit merges the switching transistor metallization with the inductor. Thick top level conductor metal that is used to strap the transistor array and to lower its on-state resistance is also used to extend the power inductor into the transistor array. Thus, the structure includes three basic components: a power inductor that spirals around the transistor array, the transistor array itself, and the transistor array metallization that is used to form a distributed inductance situated over the transistor array.

8 Claims, 7 Drawing Sheets

U.S. PATENT DOCUMENTS

| | | | |
|---|---|---|---|
| 2003/0070282 A1 | 4/2003 | Hiatt et al. | 29/602.1 |
| 2003/0122647 A1 | 7/2003 | Ou | 336/200 |
| 2005/0134419 A1* | 6/2005 | Furumiya et al. | 336/223 |
| 2006/0181386 A1* | 8/2006 | Lee et al. | 336/200 |

* cited by examiner

ON-CHIP POWER INDUCTOR

PRIORITY CLAIM

This application claims priority from U.S. Provisional Application No. 60/780,621, filed on Mar. 9, 2006, by Peter J. Hopper et al. and titled "Efficient On-Chip Power Inductor." Provisional Application No. 60/780,621 is hereby incorporated herein by reference in its entirety.

TECHNICAL FIELD

The present invention relates to power inductors and, in particular, on-chip power inductors that utilize ferromagnetic or ferrimagnetic materials, with specific application to on-chip power regulators.

DESCRIPTION OF THE INVENTION

Figure 1A:
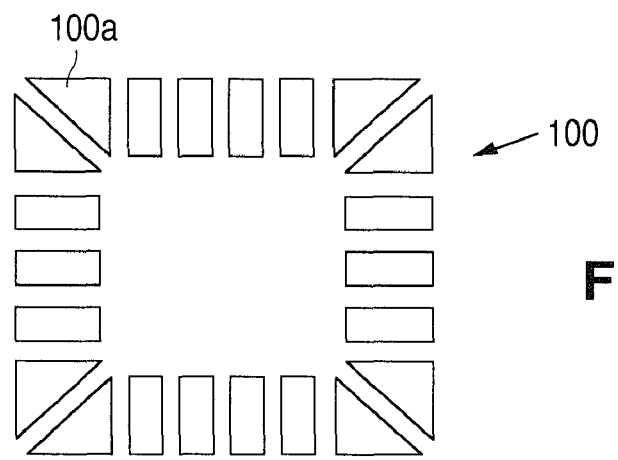
FIGS. 1A-1C are top views illustrating the top patterned magnetic plates, the conductor spiral and the bottom patterned magnetic plates, respectively, of an embodiment of a spiral inductor structure.

According to Faraday's law, any change in the magnetic environment of a coil of wire will cause a voltage to be "induced" in the coil. No matter how the change is produced, the voltage will be generated. For example, the change could be produced by changing the magnetic field strength, by moving a magnet toward or away from the coil, by moving the coil into or out of the magnetic field, or by changing the amount of current that is flowing through the coil.

In accordance with the well-known law of inductance, if a voltage is forced across an inductor, then a time-varying current will flow through the inductor. The current flowing in the inductor will be time varying even if the forcing voltage is constant. It is equally true that, if a time-varying current is forced to flow in an inductor, then a voltage across the inductor will result.

The fundamental law that defines the relationship between the voltage and current in an inductor is given by the equation:

$$V = L(di/dt)$$

Thus, current that is constant with time has a di/dt value of zero and results in zero voltage across the inductor. A current that is increasing with time has a positive di/dt value, resulting in a positive inductor voltage. A current that decreases with time gives a negative value for di/dt and, thus, for inductor voltage.

Faraday's law implies that a changing magnetic flux produces an electric field even in an empty space. If a metal plate is inserted into this empty space, then the induced electric field produces electric currents in the metal. These induced currents are called "eddy currents." If the induced currents are created by a changing magnetic field, then the eddy currents will be perpendicular to the magnetic field and will flow in circles if the B-field is uniform. The size of the eddy current circles will be proportional to the size of the metal plate.

The induced electric field is non-conservative: the work being done by the generated electric field cannot be recovered except as heat. That is, eddy currents create losses through Joule heating, thereby reducing the efficiency of many devices, e.g. inductors.

As discussed in co-pending and commonly assigned application Ser. No. 11/041,658, filed on Jan. 24, 2005, by Hopper et al. (which application is hereby incorporated by reference in its entirety), the increased demand for DC-DC power supply systems indicates that an integrated on-chip inductor with a large inductance and a good Q factor offers a significant market advance in terms of cost competitiveness. Thus, new inductor integration schemes are needed to meet these related demands for high values of inductance, i.e., with value of 50 nH and greater.

Historically, on-chip inductors are made using classic interconnect metals, such as aluminum and copper, on top of a silicon wafer. To reduce the resistance of the inductor spiral, thick and wide metal lines are used, thus increasing the overall size of the inductor. Further, power inductors for DC-DC power supply applications, for example, require even more current carrying capabilities along with larger values of inductance.

The fully-integrated DC-DC switching regulator circuit structure described in above-referenced application Ser. No. 11/041,658 utilizes a high inductance, integrated, on-chip inductor structure that has advantages for power applications. As described below, the inductor coil in this case is made of thick metal to reduce resistance. To increase the inductance of the coil, top and bottom magnetic plates are added. The magnetic plates are made of a high permeability material such as a ferromagnetic metal alloy, e.g. Permalloy. To further improve the performance of the inductor, the magnetic plates are patterned or made into broken pieces. This patterning of the magnetic layers reduces the eddy current effect, which, as discussed above, degrades the performance of the inductor.

Figure 1B:
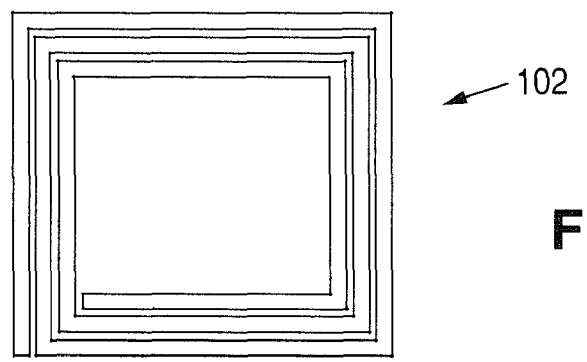
Figure 1C:
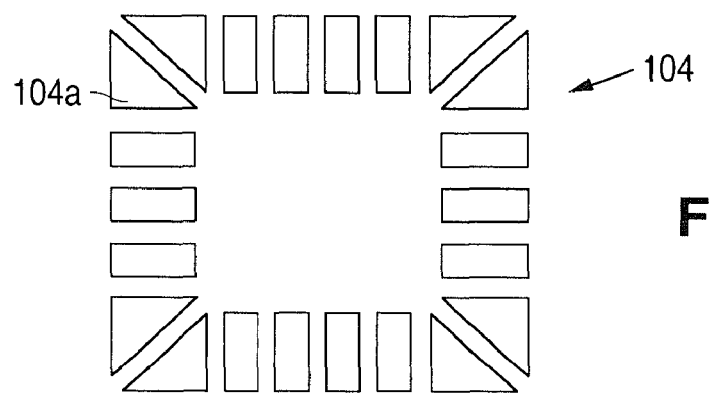

FIGS. 1A-1C combine to show a patterned inductor structure disclosed in co-pending and commonly assigned application Ser. No. 11/111,660, filed on Mar. 4, 2005, by Hwang et al. (which application is hereby incorporated by reference in its entirety). FIG. 1A shows a top patterned magnetic plate 100 that is subdivided into a plurality of spaced-apart segments 100a. FIG. 1B shows a conductive spiral coil 102. FIG. 1C shows a bottom patterned magnetic plate 104 that is subdivided into a plurality of spaced-apart segments 104a. In the disclosed embodiment, the coil 102 is preferably separated from the top patterned magnetic plate 100 and the bottom patterned magnetic plate 104 by intervening dielectric material such as oxide, nitride or a spin-on polymer (e.g., cured photoresist, polyimide or BCB). The dielectric separator material can range in thickness from zero to 10 μm, depending upon the current of the inductor. That is, as will be appreciated by those skilled in the art, for inductor currents of 50 mA to 20 Amps, there is a design trade off between low current, high mg and low saturation on the one hand and high current, lower mg and higher saturation on the other hand.

The top and bottom magnetic plates 100, 104 are preferably a material such as Permalloy (with ratios of 20:80 to 80:20 Ni:Fe), FeCrB, ZrCrTa, CoCr, or CoFeNi; the thickness of the magnetic plates is about 0.5-1000 microns. The conductive coil 102 is preferably copper about 0.5-1000 microns thick.

In the embodiment shown in FIGS. 1A-1C, the top patterned magnetic plate 100 and the bottom patterned magnetic plate 104 are patterned to be geometrically identical. Although FIGS. 1A-1C show one way of patterning the magnetic layers 100, 104, those skilled in the art will appreciate that other patterns may also be utilized and that the pattern may differ between the top plate 100 and the bottom plate 104. While it is also known that the magnitude of the eddy current decreases as the size of the pattern increase, those skilled in the art will appreciate that the pattern spacing and pitch are limited by integrated circuit process parameters such as magnetic layer thickness and etch angle.

Figure 2:
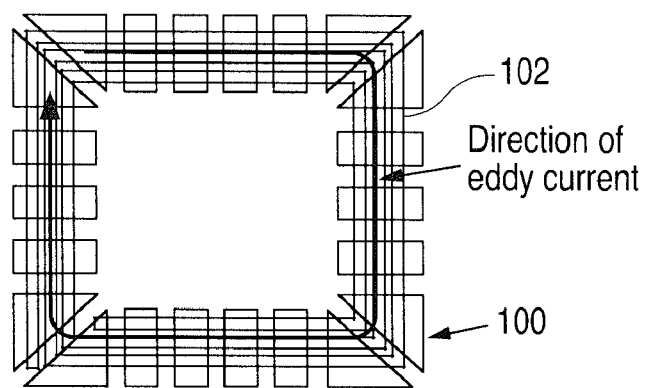
FIG. 2 is a top view illustrating the direction of the eddy currents in the spiral inductor structure shown in FIGS. 1A-1C.

FIG. 2 shows a top view of the top patterned magnetic plate 100, the conductive spiral coil 102 and bottom patterned magnetic plate 104 in combination (in FIG. 2, the bottom plate 104 is hidden by the geometrically identical upper plate 100). As shown in FIG. 2, when current flows along the inductor coil 102, eddy currents inside the magnetic layers 100, 104 are induced in the same direction as the coil. By patterning the top magnetic plate 100 and the bottom magnetic plate 104 such that edges between adjacent segments of the pattern are perpendicular to the eddy current path, as illustrated in FIG. 2, the magnitude of the eddy current can be reduced since, as discussed above, the circular eddy currents will be confined to the individual segments compared to the larger circular eddy current that would flow in a singular magnetic plate of corresponding size.

Figure 3:
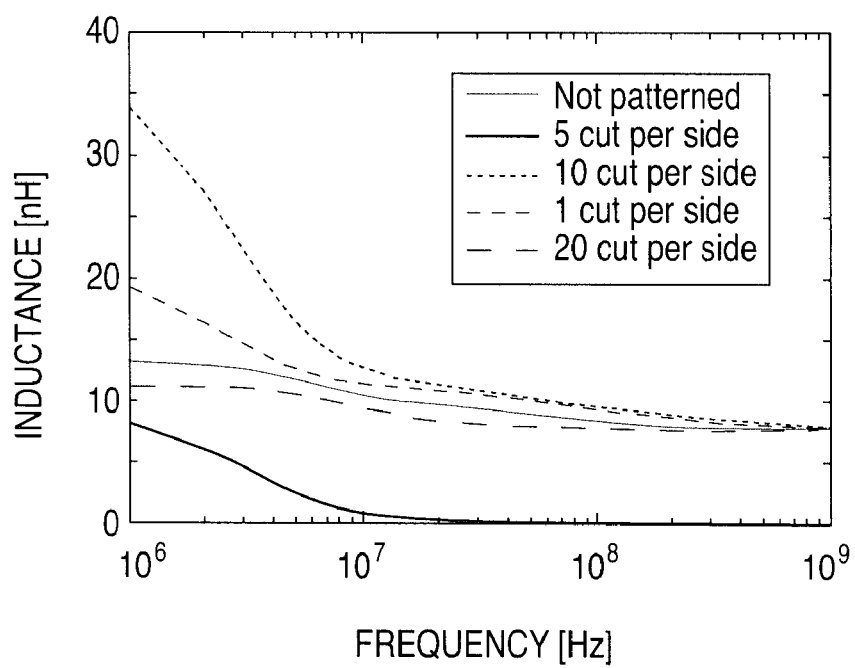
FIG. 3 provides a graph showing simulated inductance as a function of the number of cuts on each side of a magnetic layer in the spiral inductor structure shown in FIGS. 1A-1C.

FIG. 3 shows simulated inductance as a function of the number of "cuts" on each side of the patterned magnetic plates 100, 104. As can be seen from the FIG. 3 plot, when there are no cuts in the magnetic plates 100, 104, i.e., the plates are singular, monolithic structures, the inductance (nH) decreases significantly at high frequency. As the number of cuts increases, inductance increases at low frequency.

Figure 4A:
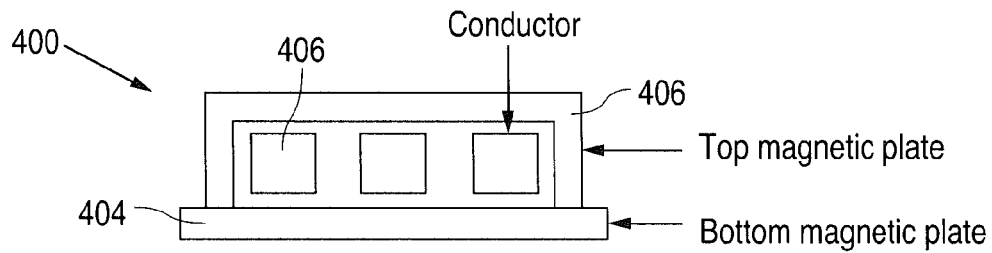
FIG. 4A is a cross section view showing the top and bottom magnetic layers of the FIGS. 1A-1C spiral inductor structure touching each other.
Figure 4B:
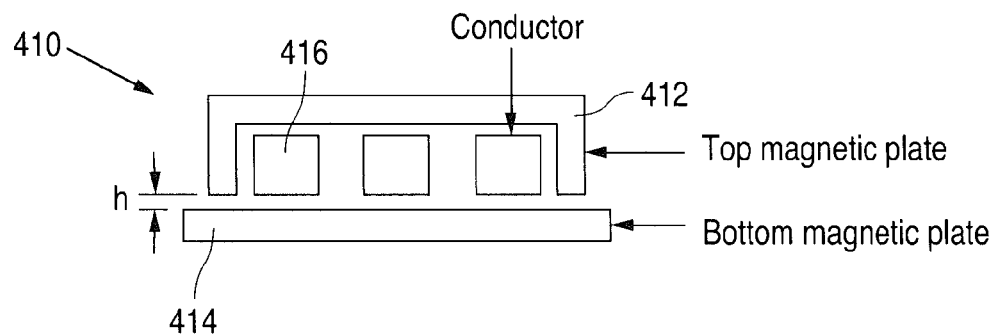
FIG. 4B is a cross section view showing the top and bottom magnetic layers of the FIGS. 1A-1C spiral inductor structure having a finite gap therebetween.

FIGS. 4A and 4B show cross-section views of two magnetic inductor structures 400 and 410, respectively. In the FIG. 4A inductor structure 400, the patterned top magnetic plate 402 and the patterned bottom magnetic plate 404 surround the conductive inductor coil 406 and touch each other; large inductance can be made by this configuration, since reluctance is minimized. In the FIG. 4B inductor structure 410, there is a finite gap (h) between the top patterned magnetic plate 412 and the bottom patterned magnetic plate 414 that surround the conductive coil 416. The magnetic path is composed of the magnetic layers 412, 414 and the gap h. Total inductance can be adjusted by changing the height (h) of the gap. Also, magnetic saturation due to high current level can be controlled by the gap height (h).

Figure 5:
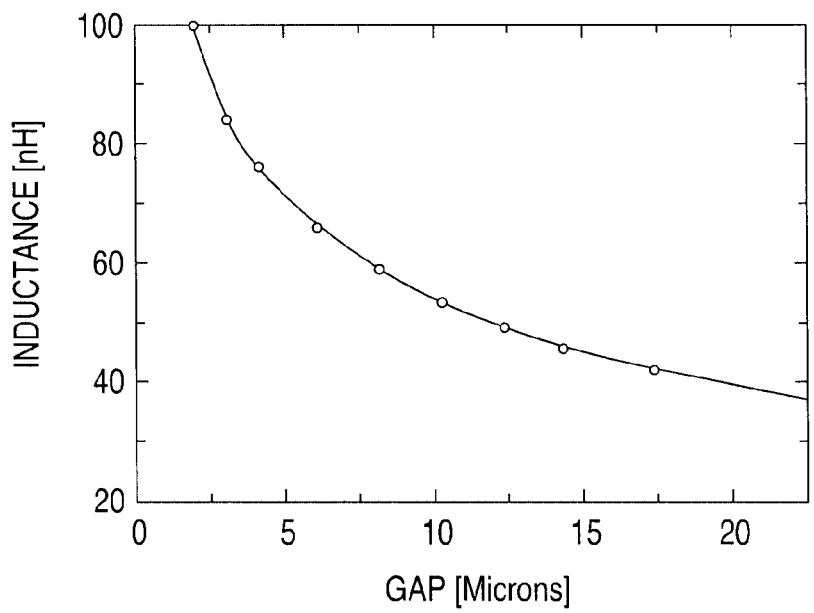
FIG. 5 provides a graph showing simulated inductance as a function of the height of the gap between the top and bottom magnetic plates in the FIG. 4B spiral inductor structure.

FIG. 5 shows simulated inductance as a function of the gap height (h) between the top magnetic plate 412 and the bottom magnetic plate 414 of the FIG. 4B configuration. As can be seen from the FIG. 5 plot, in the FIG. 4B configuration, inductance increases as the gap height (h) decreases.

Those skilled in the art will appreciate that the patterned magnetic layer on-chip inductor structures discussed above in conjunction with FIGS. 1-5 may be fabricated utilizing semiconductor integrated circuit fabrication techniques that are well known to those skilled in the art.

Co-pending and commonly assigned application Ser. No. 11/137,767, filed on May 25, 2005, by Johnson et al. (which application is hereby incorporated by reference in its entirety) discloses a method for obtaining the optimum magnetic alignment of the ferromagnetic core of an on-chip inductor structure utilizing a permanent magnet in the fabrication of the inductor structure. Utilization of this method results in maximization of the field strength and magnetic flux slope and magnitude before magnetic material saturation occurs. This leads to a further maximized inductance and provides, in turn, for a more efficient, lower-cost switching regulator design.

Figure 6:
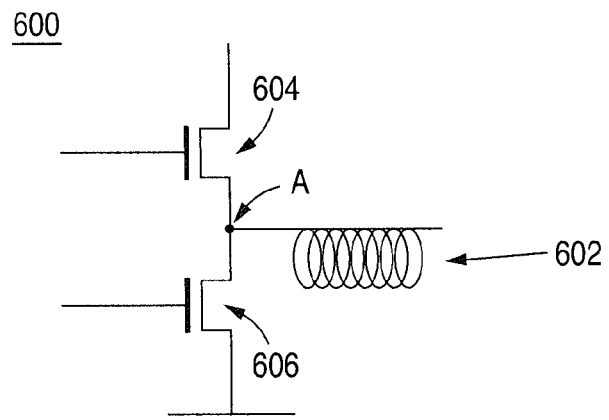
FIG. 6 is a circuit diagram illustrating a DC-DC switching regulator's inductor driven by a pair of transistors.

FIG. 6 shows a simple circuit schematic drawing of a conventional DC-DC switching regulator circuit 600 that includes an inductor 602 that is driven by a pair of MOS transistors 604, 606. The switching node is identified as "A" in FIG. 1. The inductor 602 is energized by a switching current that, in turn, leads to a switching magnetic field in the ferromagnetic material of the inductor structure. As discussed in greater detail below, magnetic domains in the ferromagnetic field are aligned to the field of the inductor 602.

Figure 7:
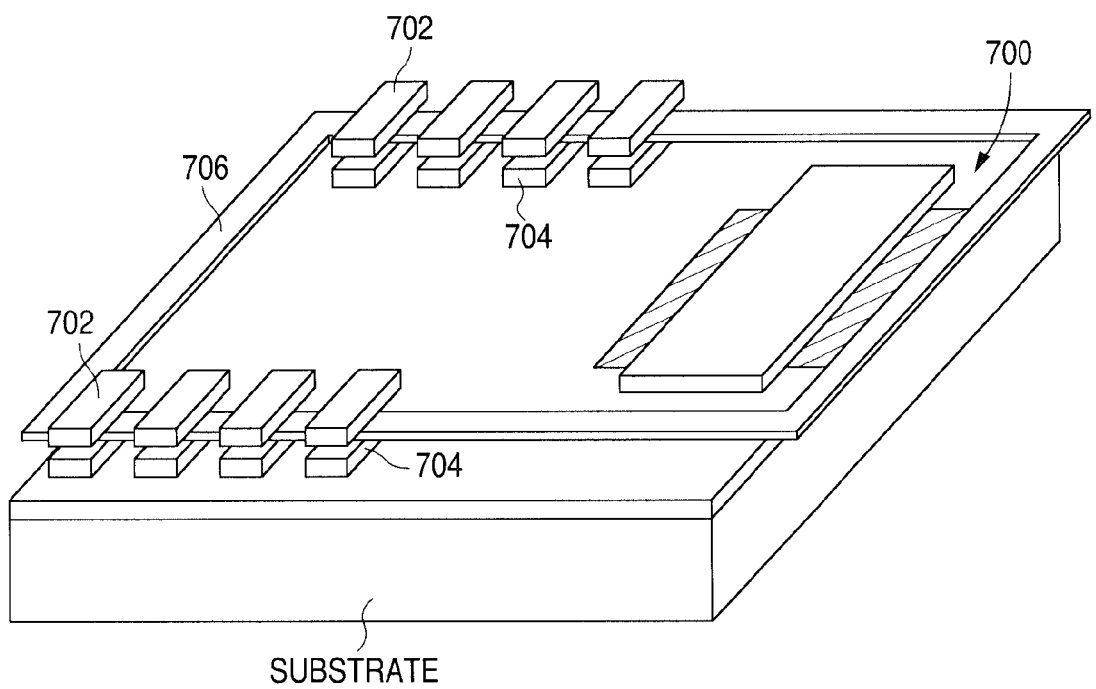
FIG. 7 is a schematic drawing illustrating an embodiment of the utilization of ferromagnetic blocks in an on-chip inductor structure.

An embodiment of a physical implementation of the ferromagnetic core material in a switching regulator circuit application is shown in the FIG. 7 schematic drawing. The large block 700 at the left side of FIG. 7 represents a conventional switching transistor structure, which, as will be appreciated by those skilled in the art, can comprise two switching transistors (as shown in the FIG. 6 embodiment) or a single switching transistor. The smaller blocks represent the upper sections 702 and lower sections 704 of the ferromagnetic core material. As shown in the FIG. 7 embodiment, both the upper core material 702 and the lower core material 704 are patterned, as disclosed in above-cited related application Ser. No. 11/111,660, to reduce eddy currents.

Preferably, the top and bottom patterned magnetic plates 702, 704 are an electroplated ferromagnetic material such as Permalloy (with ratios of 20:80 to 80:20 Ni:Fe). As discussed above, the material for the magnetic plates 702, 704 may also be selected from the group consisting of FeCrB, ZrCrTa, CoCr, CoFeNi, or other materials that are known by those skilled in the art as suitable for this application. The thickness of the magnetic plates 702, 704 is preferably about 0.5-1000 microns. The conductive coil 706 is preferably copper about 0.5-1000 microns thick. Those skilled in the art will appreciate that, while not shown in FIG. 7, an integrated spiral inductor of the type discussed above is also suitable for this application.

Figure 8:
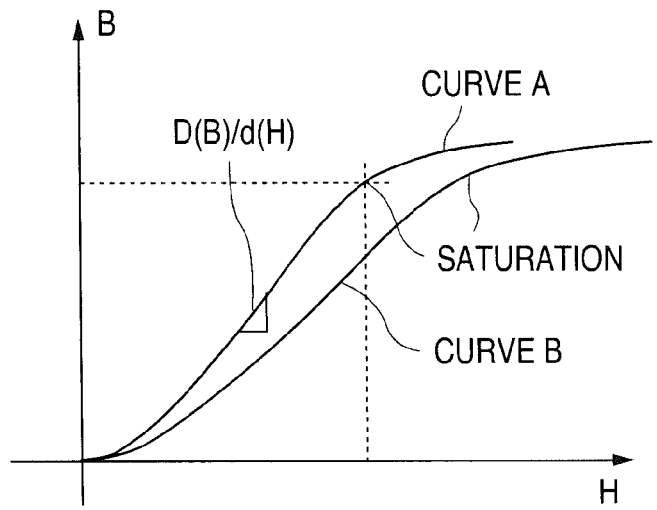
FIG. 8 is a graph that plots the B-H curve relationship for a first inductor core material A and a second inductor core material B.

In FIG. 8, Curve A and Curve B show, respectively, the B-H curve relationship for two inductor core materials. Curve A is that of a magnetic core material that saturates early. Curve B is that of a magnetic core material that saturates later, as a function of H-field. For a large switching regulator current specification, the optimum characteristic would be that whereby the "knee" of the curve occurs at the maximum current point. Thus, the inductance is maintained (L relates to d(B)/d(H)). The difference between Curve A and Curve B can be produced by aligning the ferromagnetic domains during the electroplating deposition process for the core material. Domains can be aligned by applying an external magnetic field.

Figure 9:
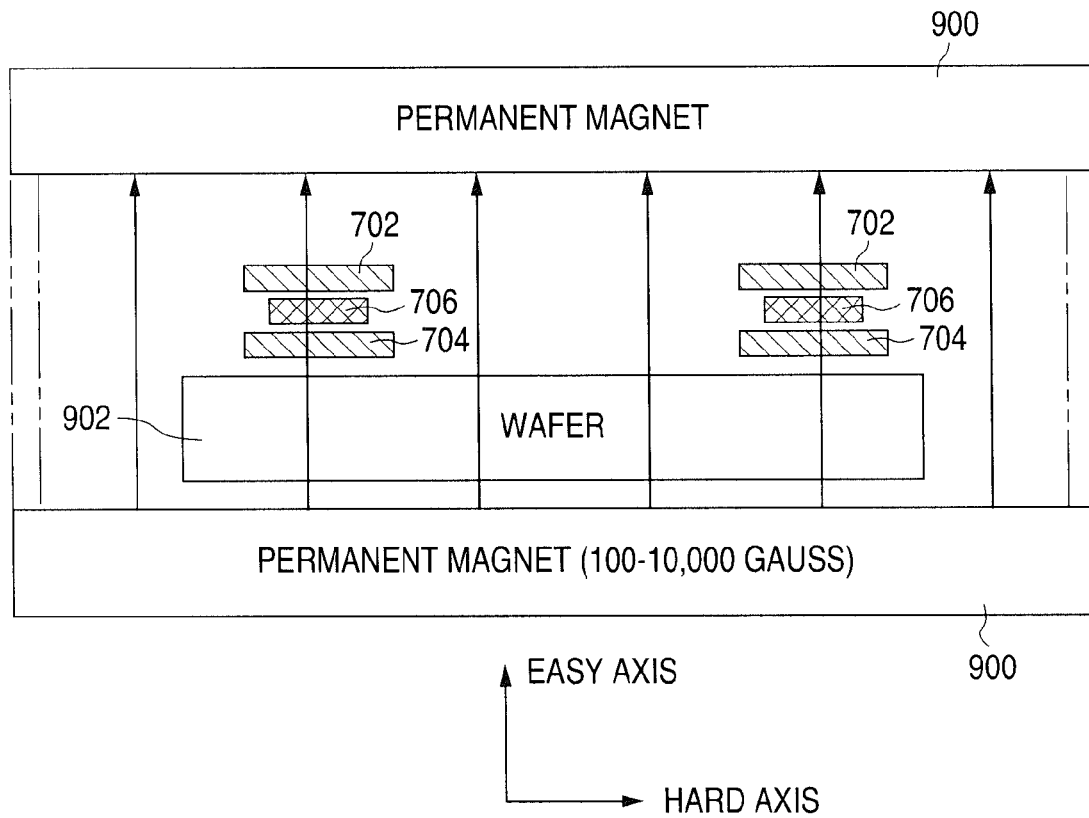
FIG. 9 is a schematic diagram illustrating a permanent magnet placed in proximity to an on-chip inductor structure.

FIG. 9 shows an embodiment of an electroplating system for depositing the ferromagnetic core material 702, 704 (FIG. 7) utilized in an on-chip inductor structure in accordance with the present invention. As shown in FIG. 9, in accordance with the invention, a static, permanent magnet 900 is placed in proximity to an integrated circuit wafer 902 being plated. The "easy" axis material is that plated parallel to the field of the permanent magnet 900 and saturates at a lower applied field, i.e. Curve A in FIG. 8. The "hard" axis material is that plated perpendicular to the applied field of the permanent magnet 900 and saturates later, at a higher current level, i.e. Curve B in FIG. 8.

Others have adopted a similar approach to modifying the anisotropy of the magnetic domains. But, due to the fact that the primary driving force was the magnetic head industry, and that a magnetic head is oriented at 90° to that of the integrated inductor structure described above, the external magnetic applied fields in those applications had to come from the edges of the wafer, laterally. Thus, the tool configuration for plating magnetic heads involved large lateral magnetic coils place on either side of the flat wafer and running in the plane of the wafer. Conversely, for the DC-DC switching regulator application disclosed herein, and as shown in FIG. 9, an external applied magnetic field orthogonal to the plane of the wafer is created to provide for an optimum inductor design in accordance with the concepts of the present invention. Electroplating techniques and integrated circuit fabrication techniques well known to those skilled in the art may be utilized in forming the upper and lower magnetic plates 702, 704 and the conductive core 706.

As discussed above, an on-chip power inductor is an attractive proposal since it offers a path to lower cost, simple to implement, power supplies for both power management chip products and for on-chip power supplies. Issues historically pertain to constructing an inductor with both enough inductance and with a low resistance. Thus, the use of embedded ferro-magnetic and ferri-magnetic materials is been proposed.

The present invention provides an efficient physical design and realization of on-chip power inductors using ferro/ferri magnetic materials, with specific application to on chip power regulators.

In the case of an integrated DC-DC switching regulator, an on-chip inductor is placed next to an array of power transistors. The power transistor array(s) may be used to switch the current running into the power inductor.

Figure 10:
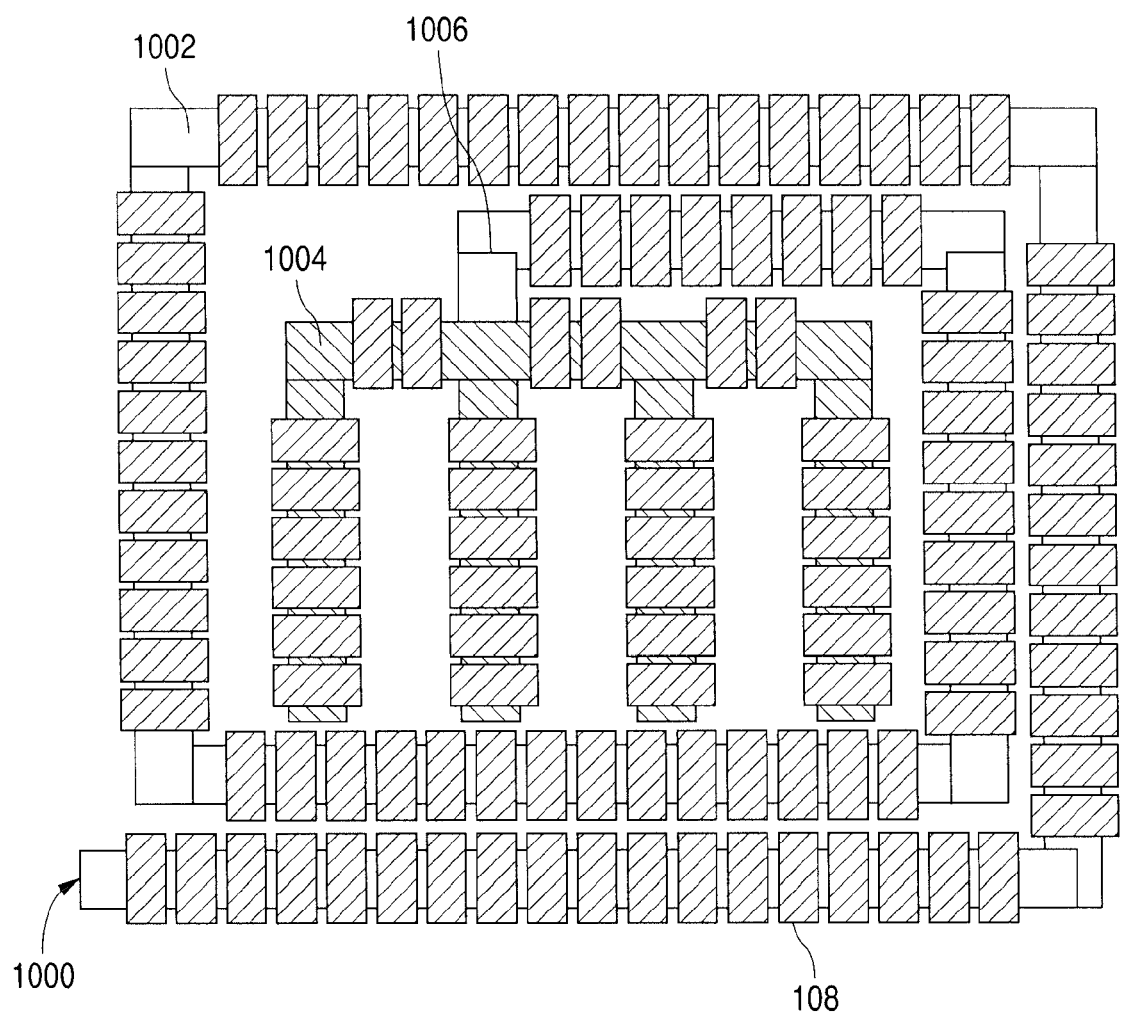
FIG. 10 shows the layout of an on-chip inductor structure with distributed inductive transistor metallization.
Figure 12:
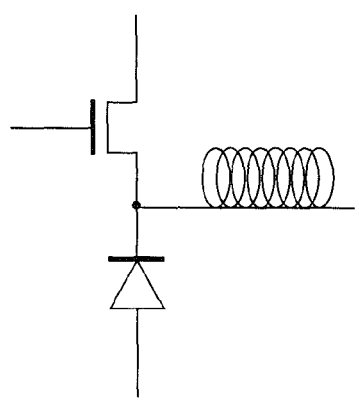
FIG. 12 shows the basic circuit topology for the FIG. 10 structure.

FIG. 10 shows the layout of an inductor structure with distributed inductive transistor metallization; a corresponding circuit topology is shown in FIG. 12. The stand-alone inductor coil portion of the design runs between the end designated 1000 in FIG. 10, continuing in a spiral inductor configuration to the switching node 1006. The ferro/ferri magnetic plates of the inductor structure are designated by numeral 1008 in FIG. 10. The distributed inductive top level transistor metallization is designated by numeral 1004 in FIG. 10.

Figure 11:
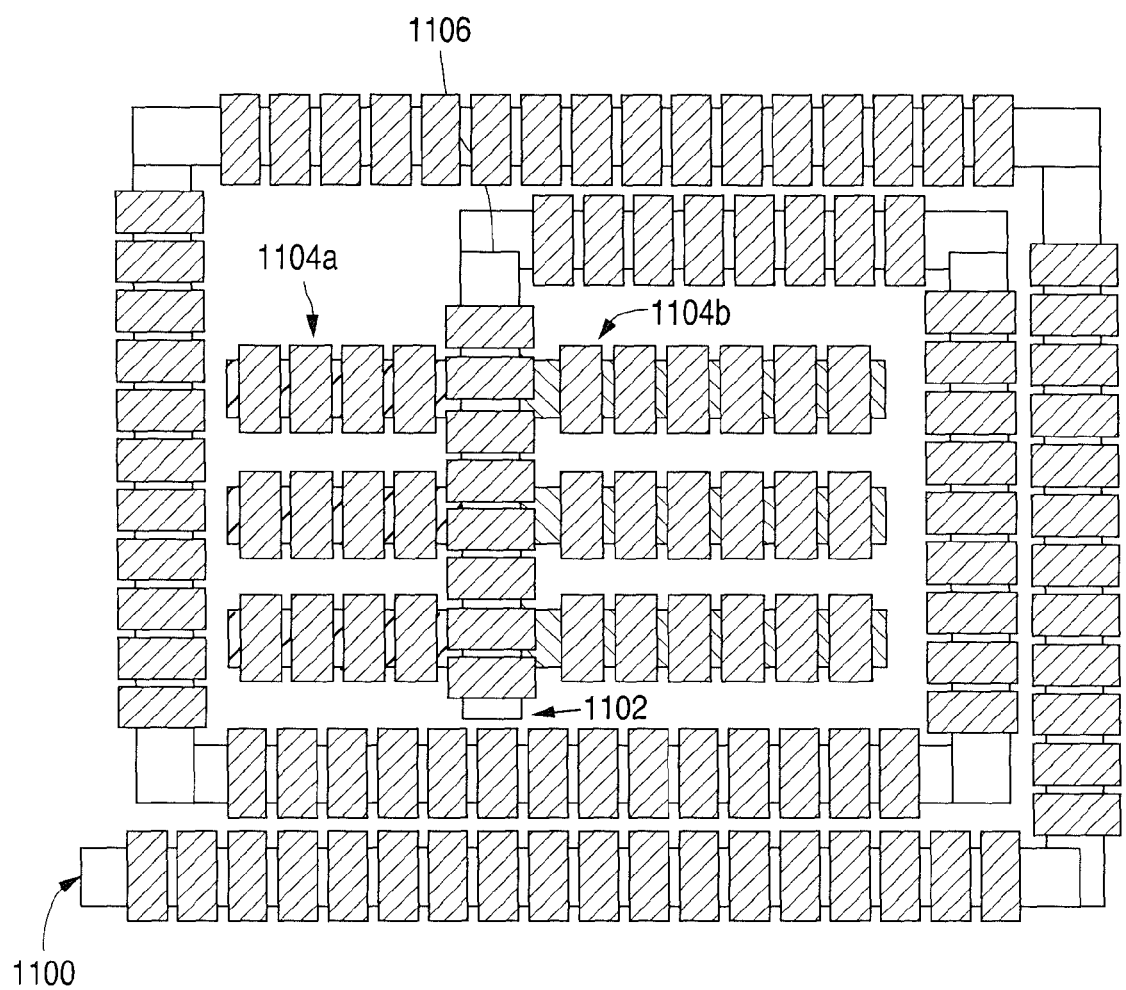
FIG. 11 shows the layout of an on-chip inductor structure with distributed inductive transistor metallization for use with both a high side and a low side transistor.
Figure 13:
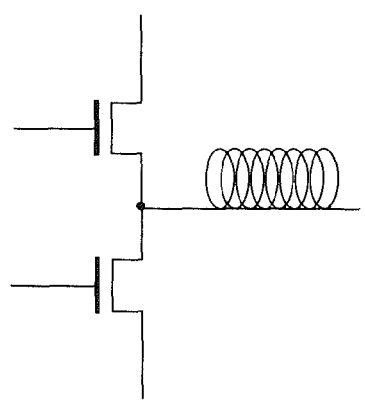
FIG. 13 shows the basic circuit topology for the FIG. 11 structure.

FIG. 11 shows a similar inductor structure topology for use by two transistors (high side and low side); the corresponding circuit topology is shown in FIG. 13. The inductor coil in the FIG. 11 embodiment extends between numeral 1100 and numeral 1102. The two transistors 1104a and 1104b are illustrated as slightly different in size. The switching node is designated by numeral 1106.

In the FIGS. 10 and 11 embodiments, the on-chip power inductor is formed by surrounding a thick conductive metal wire (e.g., Cu about 50 microns thick) with a ferromagnetic or ferromagnetic material. As discussed. These materials serve to raise the relative permeability of surrounding medium and thus to elevate the inductance. Within reason, the more ferromagnetic or ferromagnetic material that can surround the conductive wire, the more magnetization will occur, leading to a higher level of inductance. As discussed above, each surrounding magnetic material component is formed as a patterned broken ring to minimize eddy currents and skin effect related impedance roll off at high frequency operation.

Thus, the present invention provides an efficient inductor that merges the switching transistor metallization with the inductor. Thick top level conductor metal, used to strap the transistor array and to lower its "on" state resistance is also used to extend the power inductor, into the transistor array. Thus, an inductor structure in accordance with the invention includes three basic components: (i) a power inductor that spirals around a transistor array, (ii) the transistor array itself, and (iii) the transistor array metallization used to form a distributed inductance, formed over the transistor.

It should be appreciated that objectives of the designs disclosed above are to maximize the "referred" inductance to the switching node of the regulator circuit and to optimize phase control for the multiple switching devices included in the typical regulator circuit design. Thus, it should also be understood that the particular embodiments of the invention described above have been provided by way of example and that other modifications may occur to those skilled in the art without departing from the scope and spirit of the invention as expressed in the appended claims and their equivalents.

What is claimed is:

1. A power inductor structure that is formed on a semiconductor substrate as part of a semiconductor integrated circuit, the power inductor structure comprising:

a switching node;

at least one MOS transistor connected to the switching node;

a spiral power inductor connected to the switching node, the spiral power inductor including (i) a conductive coil;

(ii) a bottom metal magnetic member formed over an upper surface of the semiconductor substrate, the bottom metal magnetic member including a plurality of spaced-apart bottom member segments, each bottom member segment having a first edge that is parallel to and spaced-apart from an edge of a first adjacent bottom member segment and a second edge that is parallel to the first edge and parallel to and spaced-apart from an edge of a second adjacent bottom member segment, the first and second edges being perpendicular to the direction of current flow through the conductive coil;

(iii) a top metal magnetic member formed over the bottom metal magnetic member, the top metal magnetic member including a plurality of spaced-apart top member segments, each top member segment having a first edge that is parallel to and spaced-apart from an edge of a first adjacent top member segment and a second edge that is parallel to the first edge and parallel to and spaced-apart from an edge of a second adjacent top member segment, the first and second edges being perpendicular to the direction of current flow through the conductive coil, the bottom metal magnetic member and the top metal magnetic member defining an inductor coil region therebetween, the conductive coil being disposed in the inductor coil region to be spaced-apart from the bottom metal magnetic member and the top metal magnetic member.

2. The power inductor structure of claim 1, wherein the top metal magnetic member and the bottom metal magnetic member surround the conductive coil and are separated from each other.

3. The power inductor structure of claim 1, wherein the at least one MOS transistor consists of a single MOS switching transistor connected between a positive power supply and the switching node.

4. The power inductor structure of claim 1, wherein the at least one MOS transistor comprises a first MOS switching transistor connected between a positive power supply and the switching node and a second MOS switching transistor connected between a negative power supply and the switching node.

5. The power inductor structure of claim 1, wherein both the bottom metal magnetic member and the top metal magnetic member comprise Permalloy.

6. The power inductor structure of claim 1, wherein both the bottom metal magnetic member and the top metal magnetic member comprise Permalloy having a Ni:Fe ratio of about 20:80 to 80:20.

7. The power inductor structure of claim 6, wherein both the top and bottom metal magnetic members are about 0.5-1000 microns thick.

8. The power inductor structure as of claim 7, wherein the conductive coil comprises copper about 0.5-1000 microns thick.

* * * * *